United States Patent
Attlesey

(10) Patent No.: US 8,089,766 B2
(45) Date of Patent: Jan. 3, 2012

(54) SERVER CASE WITH OPTICAL INPUT/OUTPUT AND/OR WIRELESS POWER SUPPLY

(75) Inventor: Chad Daniel Attlesey, Rochester, MN (US)

(73) Assignee: Hardcore Computer, Inc., Rochester, MN (US)

( * ) Notice: Subject to any disclaimer, the term of this patent is extended or adjusted under 35 U.S.C. 154(b) by 0 days.

(21) Appl. No.: 13/198,088

(22) Filed: Aug. 4, 2011

(65) Prior Publication Data
US 2011/0286177 A1    Nov. 24, 2011

Related U.S. Application Data

(60) Provisional application No. 61/378,044, filed on Aug. 30, 2010.

(51) Int. Cl.
*H05K 7/20*    (2006.01)

(52) U.S. Cl. ............. 361/699; 361/679.46; 361/679.47; 361/679.53; 361/679.54; 165/80.4; 165/104.19; 62/259.2

(58) Field of Classification Search ............ 361/679.46, 361/679.47, 679.53, 679.54, 688, 689, 699–701, 361/714–727, 732, 756, 831; 165/80.3, 80.4, 165/80.5, 104.19, 104.21, 104.22, 104.33, 165/104.34, 185; 62/64, 121, 171, 310, 376, 62/259.2, 132; 174/15.1, 16.3, 252; 257/713–719, 257/723–727
See application file for complete search history.

(56) References Cited

U.S. PATENT DOCUMENTS

| | | | | |
|---|---|---|---|---|
| 4,302,793 A * | 11/1981 | Rohner | ................. | 361/699 |
| 4,493,010 A * | 1/1985 | Morrison et al. | ............ | 361/698 |
| 6,052,284 A * | 4/2000 | Suga et al. | ................... | 361/699 |
| 7,307,841 B2 * | 12/2007 | Berlin et al. | ................. | 361/699 |
| 7,403,392 B2 | 7/2008 | Attlesey et al. | | |
| 7,414,845 B2 | 8/2008 | Attlesey et al. | | |
| 7,463,485 B1 * | 12/2008 | Nishimura | ................... | 361/699 |
| 7,724,517 B2 | 5/2010 | Attlesey et al. | | |
| 7,905,106 B2 | 3/2011 | Attlesey | | |
| 7,911,782 B2 | 3/2011 | Attlesey et al. | | |
| 7,911,793 B2 | 3/2011 | Attlesey | | |
| 7,961,475 B2 * | 6/2011 | Campbell et al. | ............ | 361/748 |
| 2004/0221604 A1 * | 11/2004 | Ota et al. | ..................... | 62/259.2 |
| 2006/0007656 A1 * | 1/2006 | Symons | ........................ | 361/699 |
| 2007/0133171 A1 * | 6/2007 | Cheon | .......................... | 361/699 |
| 2008/0017355 A1 | 1/2008 | Attlesey et al. | | |
| 2008/0238633 A1 * | 10/2008 | Siebert | ........................ | 340/10.51 |
| 2010/0226094 A1 | 9/2010 | Attlesey et al. | | |

OTHER PUBLICATIONS

U.S. Appl. No. 13/182,866, filed Jul. 14, 2011.

\* cited by examiner

*Primary Examiner* — Michail V Datskovskiy
(74) *Attorney, Agent, or Firm* — Hamre, Schumann, Mueller & Larson, P.C.

(57) ABSTRACT

A liquid submersion-cooled computer that is configured to reduce physical structures passing through walls of the computer liquid-tight computer case, which eliminates the amount of sealing needed around those physical structures and reduces the number of possible fluid leakage paths from the interior of the computer that contains a cooling liquid submerging at least some of the computer components. The computer includes a mechanism to pass input/output signals into and from the computer without any physical structure extending through any of the plurality of walls. The computer also has a mechanism for wirelessly transferring power into the interior space of the computer case, and a switch that controls power in the computer without having any physical structure extending through any of the plurality of walls.

20 Claims, 6 Drawing Sheets

SERVER CASE WITH OPTICAL INPUT/OUTPUT AND/OR WIRELESS POWER SUPPLY

CROSS REFERENCE TO RELATED APPLICATIONS

This application claims the benefit of U.S. Provisional Application 61/378,044 filed Aug. 30, 2010, which application is incorporated by reference herein in its entirety.

In addition, this application relates to U.S. Pat. No. 7,403,392; U.S. Publication No. 2008/0196870; U.S. Publication No. 2008/0017355; U.S. Pat. No. 7,724,517; U.S. Pat. No. 7,414,845; U.S. Publication No. 2009/0260777; U.S. application Ser. No. 12/795,854; and U.S. application Ser. No. 12/714,904, each of which is incorporated by reference herein in its entirety.

TECHNICAL FIELD

This disclosure relates to a liquid submersion-cooled electronic system, and in particular, to a case that is used in a liquid submersion-cooled electronic device, for example, a computer such as a server computer or a personal computer.

BACKGROUND

Typical computers are air cooled and thus the computer cases have openings allowing air flow into, through and out of the cases to allow the air to exchange heat with the computer electronics for cooling the electronics. However, conventional computer cases are not suitable for liquid submersion-cooled computers because the openings in the case would allow liquid to leak from the case. Sealing the openings is possible, although each sealed opening forms a possible leakage path for liquid to escape from the case. In addition, any joint between two separate physical structures of a computer case forms a possible leakage path.

SUMMARY

A liquid submersion-cooled computer is described that is configured to reduce physical structures passing through walls of the computer liquid-tight computer case, which eliminates the amount of sealing needed around those physical structures and reduces the number of possible fluid leakage paths from the interior of the computer that contains a cooling liquid submerging at least some of the computer components.

Examples of liquid submersion-cooled computers to which the concepts described herein include, but are not limited to, server computers such as blade servers and personal computers. The concepts described herein can also be applied to other liquid submersion-cooled electronic devices including, but not limited to, disk arrays/storage systems; storage area networks; network attached storage; storage communication systems; work stations; routers; telecommunication infrastructure/switches; wired, optical and wireless communication devices; cell processor devices; printers; power supplies; displays; optical devices; instrumentation systems, including hand-held systems; military electronics; etc.

In one embodiment, the liquid submersion-cooled computer has a housing including a plurality of walls that define a liquid-tight interior space, a liquid inlet in a wall of the housing, a liquid outlet in a wall of the housing, and a dielectric cooling liquid disposed within the interior space. A logic board is disposed in the interior space of the housing, and heat generating computer components are disposed on the logic board. At least some of the heat generating computer components are submerged in the dielectric cooling liquid.

In order for the computer to function, there must be some way to pass input/output signals into and from the housing, and to pass power into the housing to power the computer components and other components in the housing. In addition, most computers have an on/off power switch to turn the computer on and off. Typically, input/output, power and a power switch extend physically through one or more walls of the computer housing. However, in a liquid submersion-cooled computer, any structure passing through a wall of the housing must be sealed to prevent fluid leakage, and even if sealed, a potential leakage path is formed.

To minimize the need for sealing and to reduce the number of leakage paths, in one embodiment the computer is provided with a means for passing input/output signals to/from the logic board, where the means for passing input/output signals does not have any physical structure thereof extending through any of the plurality of walls. The means for passing input/output signals can be any mechanism suitable for passing input/output signals into/from the housing without requiring any physical structure passing through a wall of the housing. For example, the means for passing input/output signals can be an optical input/output unit that is coupled to or near one of the walls, for example a front wall or a rear wall. To facilitate passage of optical signals, some or all of the front or rear wall can be optically transparent.

In another embodiment, the computer is provided with a means for wirelessly transferring power into the interior space of the housing, where the means for wirelessly transferring power does not have any physical structure thereof extending through any of the plurality of walls. The means for wirelessly transferring power can be any mechanism suitable for wirelessly passing power through a wall of the housing without requiring any physical structure passing through a wall of the housing. For example, the means for wirelessly passing can be an induction mechanism such as an induction coupling, an electrodynamic induction mechanism, or an electrostatic induction mechanism.

In another embodiment, the computer is provided with an on/off switch means for controlling power in the computer, where the switch means does not have any physical structure thereof extending through any of the plurality of walls. The on/off switch means can be any type of switch suitable for controlling power in the computer without requiring any physical structure passing through a wall of the housing. For example, the switch means can be a proximity switch that senses a person in proximity to the switch to switch power on or off.

When the computer is, for example, a server computer, plurality of the server computers can be arranged in an array on a server rack. In addition, the computer can have a single logic board or a plurality of logic boards disposed within the interior space. Each logic board(s) includes a number of heat-generating components, including at least one processor, for example, a CPU or a GPU. In addition, other heat-generating components of the computer can be submerged in the cooling liquid, for example, power supplies, RAM, daughter cards and storage drives such as solid-state drives or mechanical hard drives.

DRAWINGS

DETAILED DESCRIPTION

A liquid submersion-cooled electronic device is described. Examples of electronic devices to which the concepts described herein can be applied include, but are not limited to: computers including server computers such as blade servers, and personal computers; disk arrays/storage systems; storage area networks; network attached storage; storage communication systems; work stations; routers; telecommunication infrastructure/switches; wired, optical and wireless communication devices; cell processor devices; printers; power supplies; displays; optical devices; instrumentation systems including hand-held systems; military electronics; etc.

For sake of convenience, this description will describe the electronic device as a liquid submersion-cooled blade server computer. However, it is to be realized that the concepts described herein could be used on other liquid submersion-cooled electronic devices as well.

Figure 1:
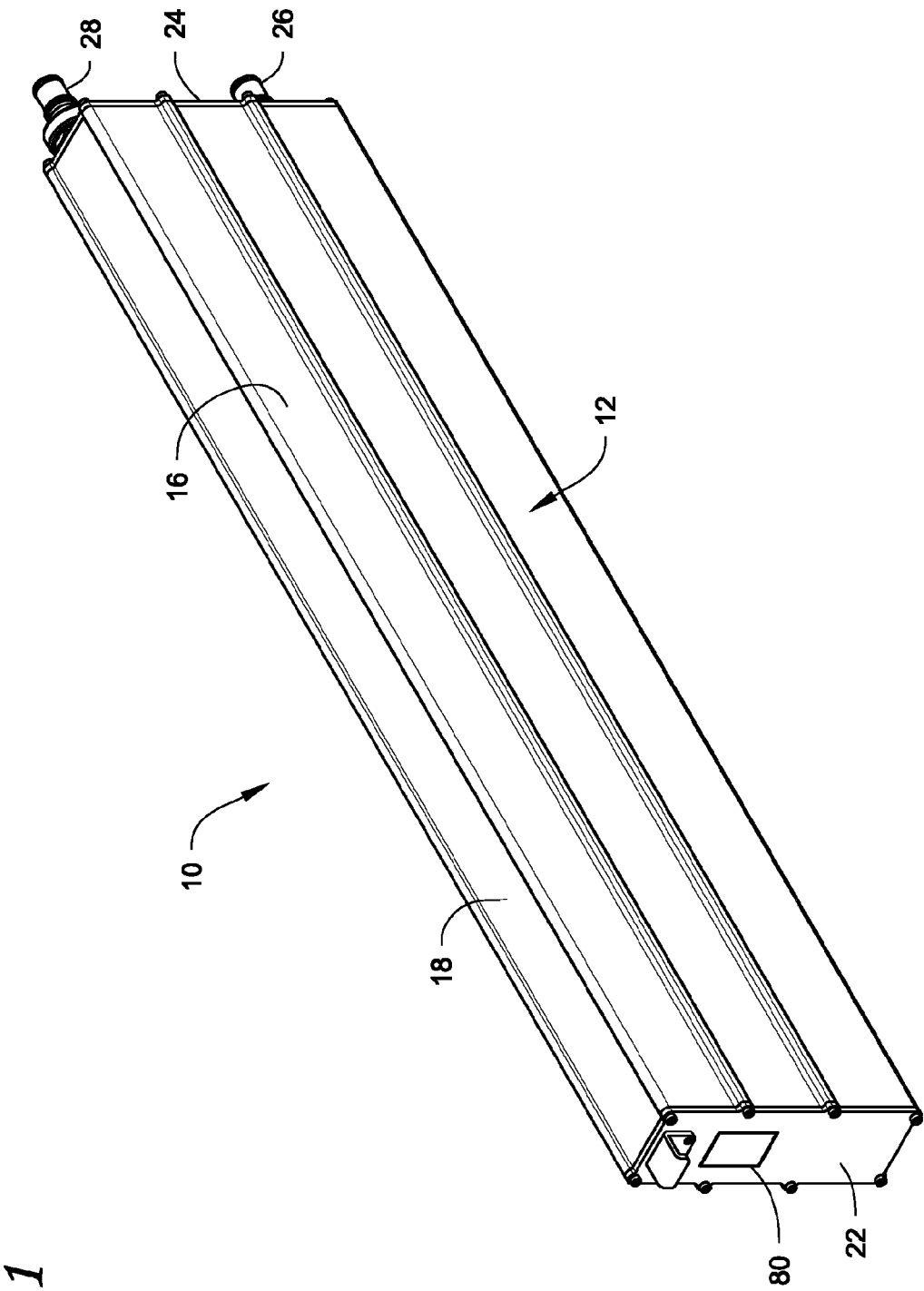
FIG. 1 illustrates a server computer case as described herein.
Figure 2:
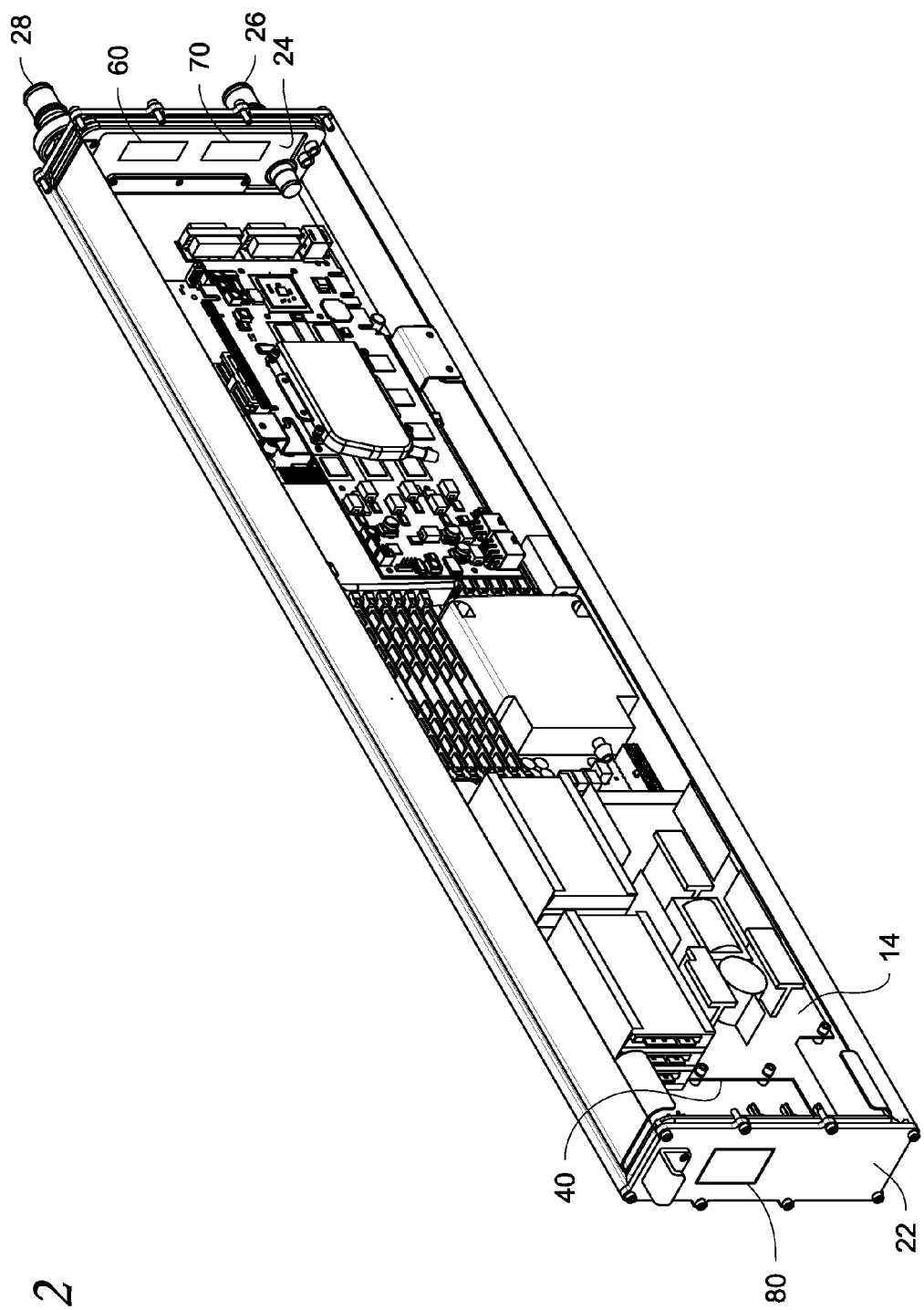
FIG. 2 illustrates the server computer case of FIG. 1 with one of the side walls removed to show the electronics within the case.
Figure 3:
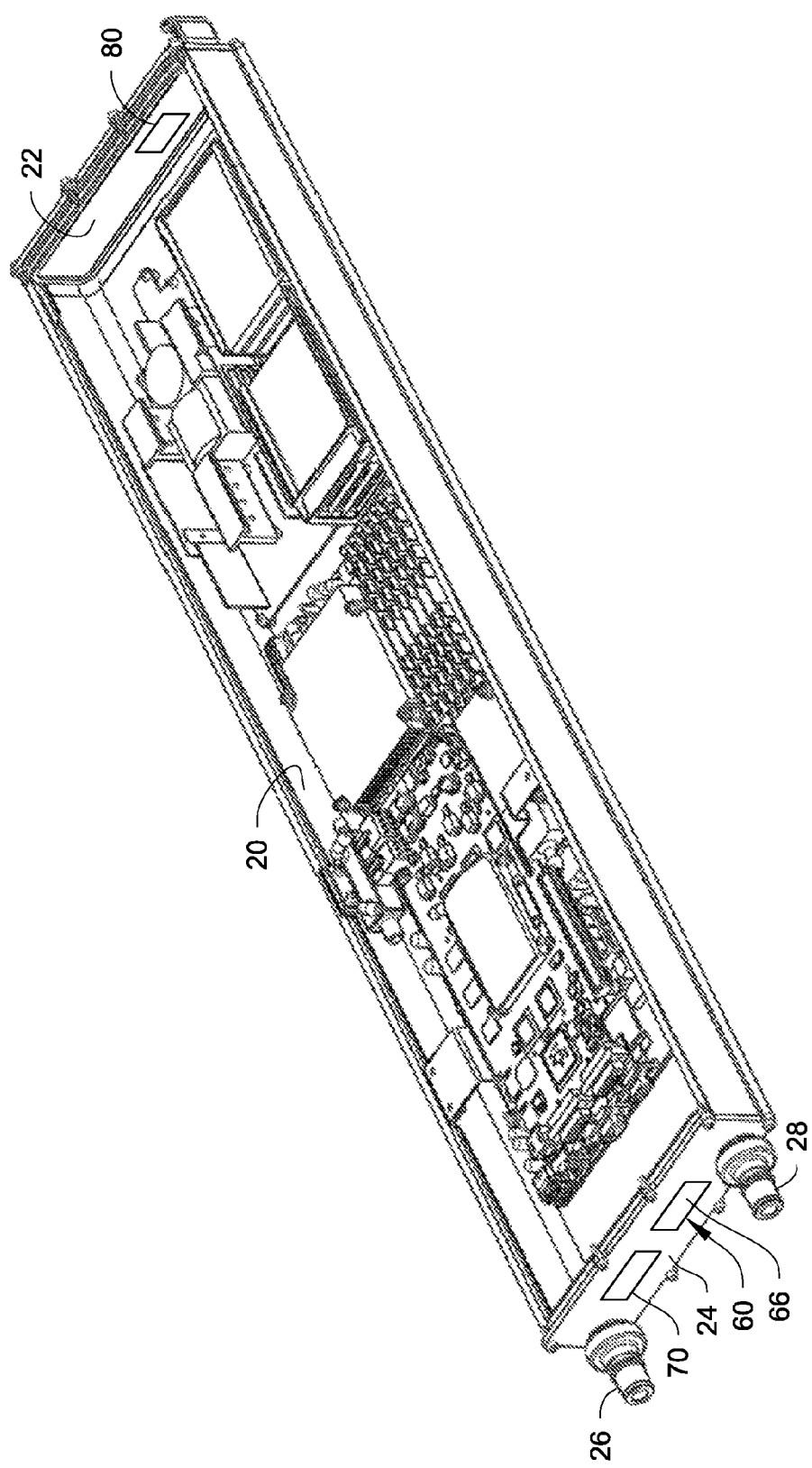
FIG. 3 is a rear perspective view showing the rear wall of the case.

FIGS. 1-3 illustrate a liquid submersion-cooled blade server computer 10 having a case or housing 12. The case includes a plurality of walls that define a liquid-tight interior space 14. The walls include a pair of side walls 16 (only one side wall is visible in FIGS. 1-3), a top wall 18, a bottom wall 20, a front wall 22 and a rear wall 24. The terms front, rear, top, bottom, and side refer to the relative positions of the walls when the computer 10 is properly oriented during use.

When the walls are assembled together they form the liquid-tight interior space 14 which is designed to contain the server electronics and a cooling liquid that submerges some or all of the server electronics. The rear wall 24 includes a valved liquid inlet 26 and a valved liquid outlet 28 to allow cooling liquid to enter and exit the interior space 14. Therefore, a liquid-tight interior space is intended to mean that there is no unintentional leakage or other unintentional discharge of cooling liquid from the interior of the case 12, despite there being the ability for cooling liquid to intentionally flow into and out of the case 12 through the inlet and the outlet. Although the inlet 26 and the outlet 28 are illustrated in this embodiment as being in the rear wall 24, the inlet and the outlet could be formed in other walls, for example the front wall 22, and the inlet and the outlet need not be in the same wall.

In use, the inlet 26 and the outlet 28 are connected to a thermal dissipation or recovery device (not shown). The thermal dissipation or recovery device can be any device that is suitable for dissipating heat or allowing recovery of the heat from the cooling liquid from inside the case. For example, the device can be a simple heat exchanger, such as a radiator, for dissipating heat. Air or liquid could be used as the heat exchanging medium. In addition, the heat exchanger could be disposed underground to allow the relatively cool ground to cool the liquid. The external heat exchanger can take on a number of different configurations, as long as it is able to cool the liquid down to an acceptable temperature prior to being fed back into the case. Examples of thermal dissipation devices include, but are not limited to, a cooling stack, evaporation, and an in-ground loop. A pump is used to pump the cooling liquid from the case, to the thermal dissipation or recovery device, and back into the case. Further information on thermal dissipation or recovery devices can be found in U.S. Patent Application Publication No. 2009/0260777, which is incorporated by reference in its entirety.

With reference to FIGS. 2 and 3, a plurality of electronically and/or thermally active computer components that together form a complete computing system, for example forming a server computing system, are disposed within the case 12. Examples of computer components that are electronically and/or thermally active include, but are not limited to, processors, one or more power supply units, memory and storage devices, management hardware, and other components. For a server computer, the computer components are mounted on a server logic board 40 that is suitably fixed in the interior space 14 of the case.

A cooling liquid that submerges at least some or all of the heat generating components of the computer is within the interior space 14 so that the submerged components are in direct contact with the cooling liquid inside the case 12. The cooling liquid can be, but is not limited to, a dielectric liquid. Dielectric liquids that can be used include, but are not limited to:

Engineered fluids like 3M™ Novec™
Mineral oil
Silicone oil
Natural ester-based oils, including soybean-based oils
Synthetic ester-based oils The cooling liquid can be single phase or two-phase. It is preferred that the liquid have a high enough thermal transfer capability to handle the amount of heat being generated by the submerged components so that the liquid does not change state. Enough of the liquid is present in the case 12 in order to submerge the heat generating components of the computer that one wishes to submerge. So in some instances the liquid may fill substantially the entire case 12, while in other instances the liquid may only partially fill the case 12.

Figure 6:
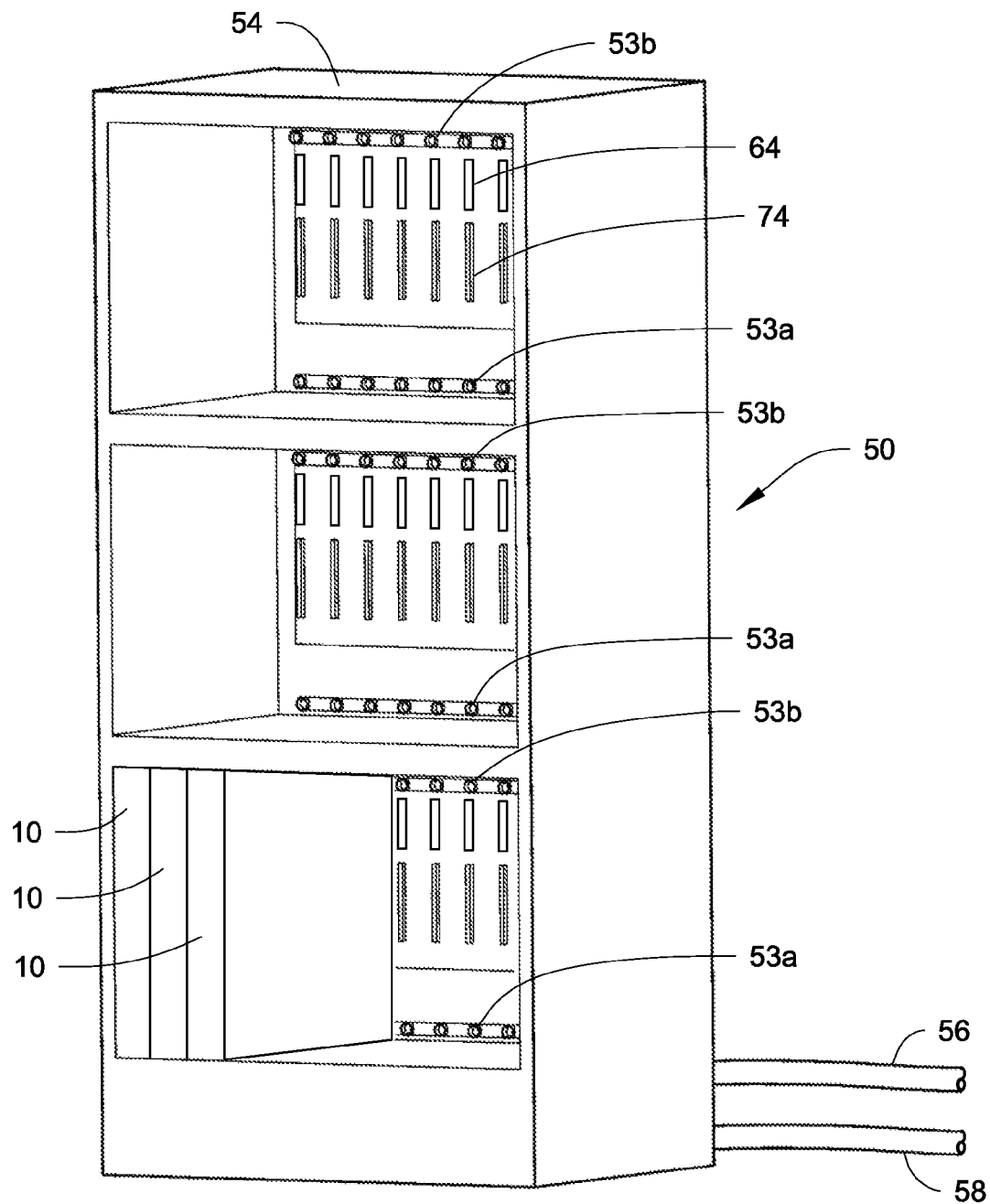
FIG. 6 shows the rack system that holds the array of cases.

With reference to FIG. 6, a plurality of the server computers 10 can be arranged in an array on a server rack 50. The rack 50 includes inlet 53a and outlet 53b manifolds disposed at the rear of the rack. The flow lines of the inlet and outlet manifolds 53a, 53b leading to each case 12 can utilize quick-disconnect valves that engage with quick-disconnect valves on the inlet 26 and the outlet 28, so that the valves on the inlet and the outlet and the valves on the manifolds 53a, 53b can automatically open upon installation of a case and automatically close upon removal of the case. The quick-disconnect valves would allow the change-out of a failed server computer using a hot swappable system architecture.

The rack 50 includes a frame 54, a coolant return line 56 connected to the inlet manifolds 53a at the rear of the frame 54, and a coolant outlet line 58 connected to the outlet manifolds 53b. The computers 10 are each mountable on the frame 54 to support the computers in the desired array configuration. The frame 54 in FIG. 6 is illustrated as being capable of supporting three vertically-spaced rows of computers that are slid into the frame 54. Each computer 10 can be provided with means to facilitate sliding insertion and removal of the computer.

Returning now to FIGS. 1-3, the computer 10 is provided with means 60 for passing input/output signals to/from the logic board into the case 12 and from the case 12. To minimize sealing and reduce a potential leakage path, the means 60 for passing input/output signals to and from the computer 10 does not have any physical structure thereof extending through any of the plurality of walls. The means 60 for passing input/output signals can be any mechanism suitable for passing input/output signals into/from the case 12 without requiring any physical structure passing through a wall of the housing. In the embodiment illustrated in FIGS. 2 and 3, the means 60 for passing input/output signals is positioned to pass input/output signals through the rear wall 24. However, the means 60 for passing input/output signals can be positioned to pass input/output signals through any of the walls, including the front wall 22.

Figure 4:
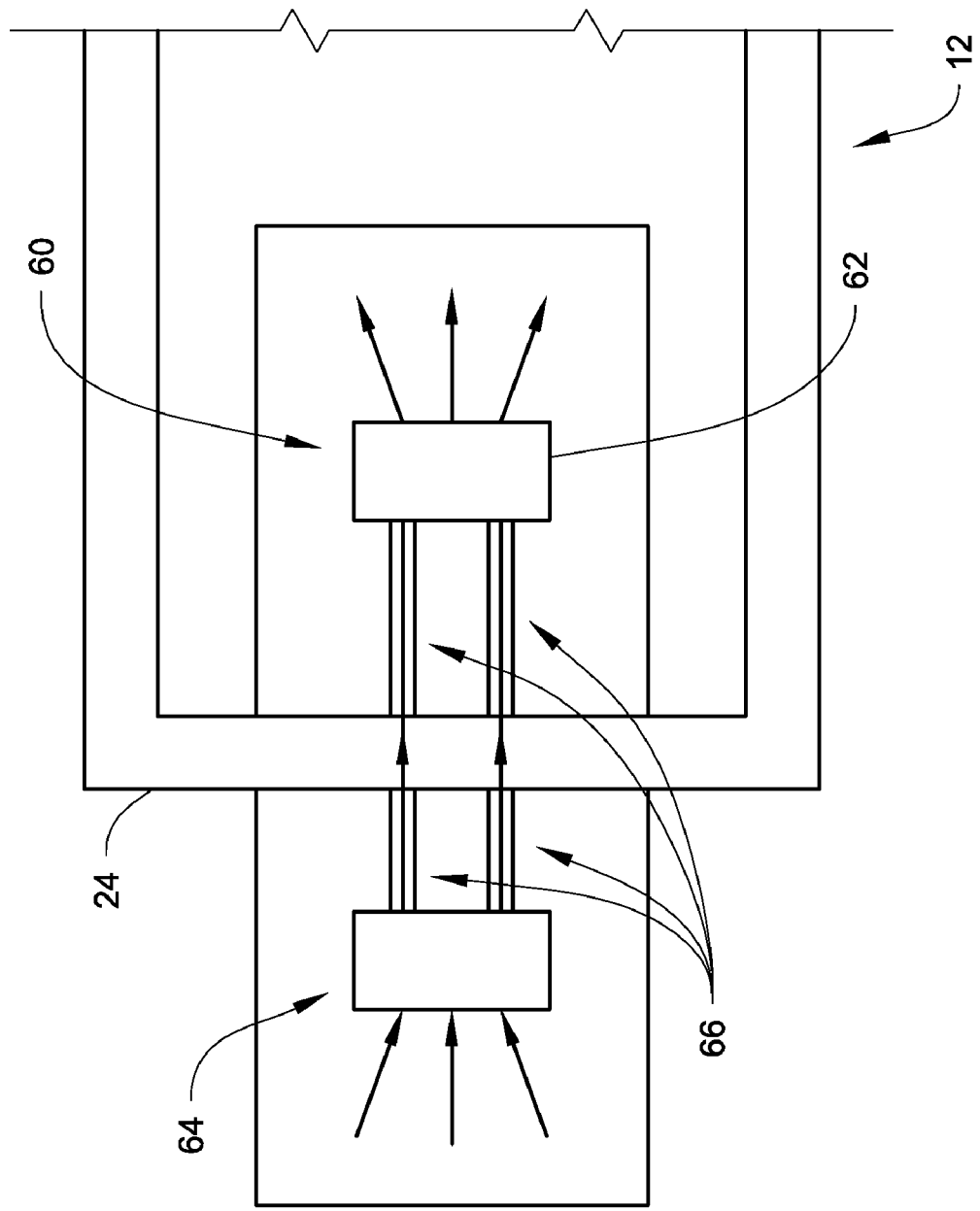
FIG. 4 shows an example of the optical input/output unit.

Referring to FIG. 4, an example of the means 60 for passing input/output signals is illustrated in the form of an optical input/output unit that provides optical input/output connections. In this example, the unit is coupled to or near the rear wall 24 to enable external component IO and storage IO to pass into and out of the case 12 to and from the logic board 40 and its components. In this example, the optical I/O unit 60 includes an optical-to-digital/digital-to-optical converter mechanism 62, such as, for example, a digital fiber optical-to-digital/digital-to-optical coaxial converter, that is disposed within the case 12 adjacent the rear wall 24, for example mounted on the interior surface of the rear wall. The converter mechanism 62 receives optical signals through the rear wall that are then converted by the converter mechanism 62 into digital signals which are then distributed to the proper electronic components inside the case 12. The converter mechanism 62 also takes digital signals from the electronic components inside the case 12 and converts them into optical signals for transmission outside the case 12.

The optical I/O unit 60 interfaces with a corresponding digital-to-optical/optical-to-digital converter mechanism 64 that is disposed on the backplane of the rack 50 as shown in FIG. 6. The converter mechanism 64 converts digital signals into optical signals for transmission into the case 12, and receives optical signals from the case and converts the received optical signals into digital signals. As shown in FIG. 4, when the computer 10 is mounted in the rack, the rear wall 24 is adjacent to the converter mechanism 64 to permit the passage of optical I/O signals through the rear wall 24.

The converter mechanisms 62, 64 can employ one or more optical conduits 66, such as, for example, optical lenses and optical fibers, to facilitate transmission of the optical signals between the converter mechanisms 62, 64. The rear wall 24 should be optically transparent between the converter mechanisms 62, 64 to allow passage of the optical signals. For example, some or all of the rear wall can be made of a transparent material to make the rear wall light transmissive. For example, a transparent I/O window 66 (FIG. 3) can be provided in the rear wall, or the entire rear wall can be made transparent.

Referring to FIGS. 1-3, the computer 10 is also provided with means 70 for wirelessly transferring power into the interior space of the housing. To minimize sealing and reduce a potential leakage path, the means 70 for wirelessly transferring power does not have any physical structure thereof extending through any of the plurality of walls. The means for wirelessly transferring power can be any mechanism suitable for wirelessly passing power through a wall of the housing without requiring any physical structure passing through a wall of the housing. In the embodiment illustrated in FIGS. 2 and 3, the means 70 for wirelessly transferring power is positioned to pass power through the rear wall. However, the means 70 for wirelessly transferring power can be positioned to pass power through any of the walls, including the front wall 22. The means 70 for wirelessly transferring power can be an induction mechanism, such as an induction coupling, an electrodynamic induction mechanism, or an electrostatic induction mechanism.

Figure 5:
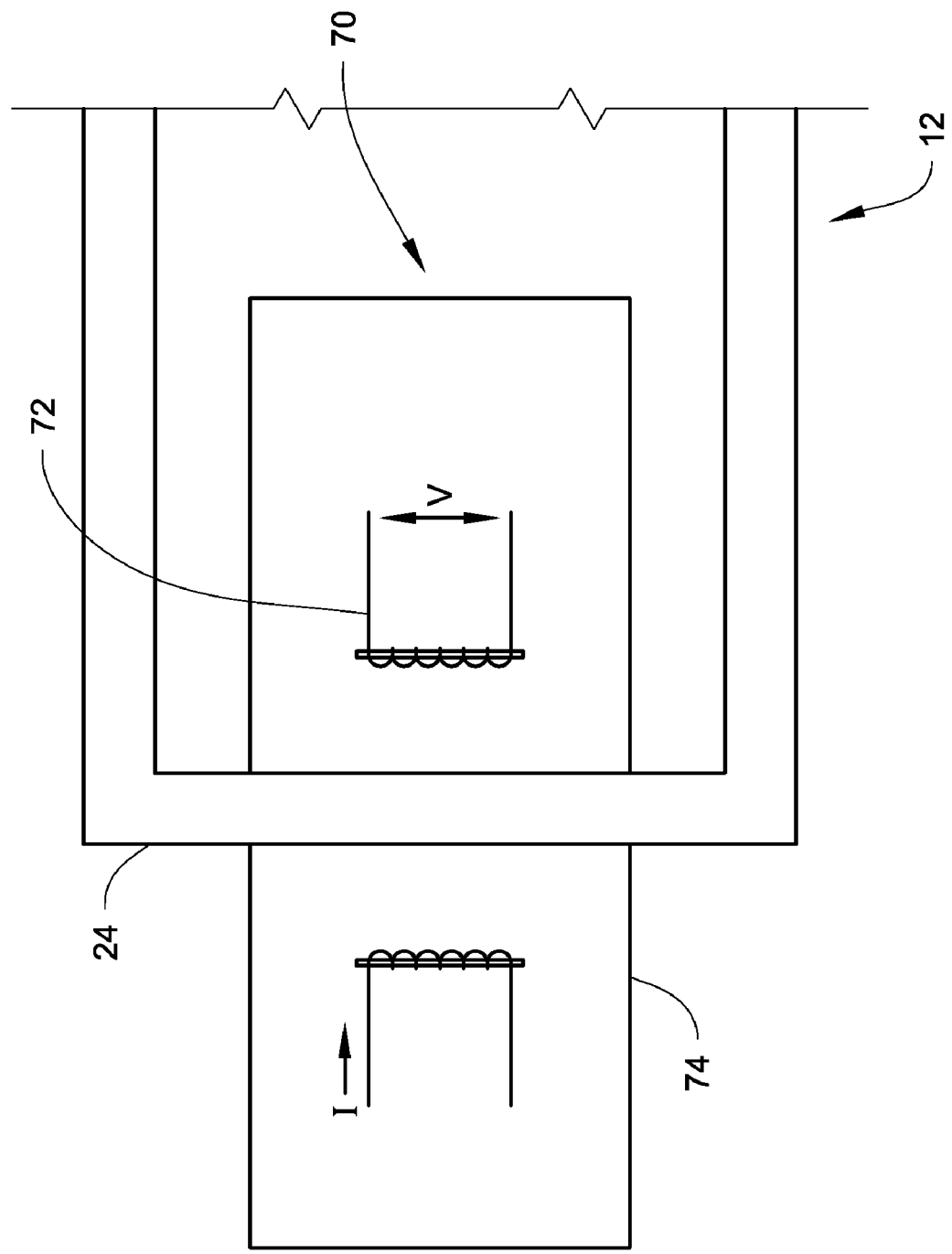
FIG. 5 shows an example of the transformer unit.

One example of the means 70 for wirelessly transferring power is illustrated in FIG. 5. In this illustrated example, the means for wirelessly transferring power comprises an induction coil 72 inside the case 12 on or adjacent to the interior surface of the rear wall 24. The induction coil 72 is positioned to interface with a power port 74 that includes an induction coil that is disposed on the backplane of the rack 50 as shown in FIG. 6 when the computer is mounted on the rack 50. As shown in FIG. 5, when the computer 10 is mounted in the rack, the rear wall 24 is adjacent to the induction coil of the power port 74 to permit the passage of optical I/O signals through the rear wall 24.

The induction coil of the power port 74 creates an alternating electromagnetic field. The electromagnetic field produces an electrical current in the induction coil 72 which is then used to provide power to the electronic components within the case 12. Suitable electromagnetic shielding is provided around the power port 74 and the means 70 for wirelessly transferring power to prevent electromagnetic interference with adjacent computers in the rack and with electronic components inside the case 12.

Referring to FIGS. 1-3, the computer 10 is also provided with an on/off switch means 80 for controlling power in the computer. To minimize sealing and reduce a potential leakage path, the switch means 80 does not have any physical structure thereof extending through any of the plurality of walls. The on/off switch means can be any type of switch suitable for controlling power in the computer without requiring any physical structure passing through a wall of the housing.

In the embodiment illustrated in FIGS. 1-3, the switch means 80 is a proximity switch that senses a person in proximity to the switch to switch power on or off. The switch means 80 could also be a touch switch where a user has to physically touch a wall adjacent the switch to activate the switch. For example, the touch switch can be a capacitance touch switch or a resistance touch switch. In the embodiment illustrated in FIGS. 1-3, the switch means 80 is positioned on or near the interior surface of the front wall 22. However, the switch means 80 can be positioned adjacent any of the walls, including the rear wall 24.

The embodiments disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A server computer, comprising:
   a housing including a plurality of walls that define a liquid-tight interior space;
   a liquid inlet in a wall of the housing;
   a liquid outlet in a wall of the housing;
   a server logic board disposed in the interior space of the housing, and heat generating computer components disposed on the server logic board;
   a dielectric cooling liquid disposed within the interior space and submerging the heat generating computer components; and
   an input/output unit configured to provide input/output connections to/from the computer components on the server logic board, the input/output unit does not have any physical structure thereof extending through any of the plurality of walls.

2. The server computer of claim 1, wherein the input/output unit is an optical input/output unit that provides optical input/output connections.

3. The server computer of claim 1, wherein the optical input/output unit comprises an optical-to-digital converter disposed inside the housing and configured to receive transmitted optical signals and convert received optical signals into digital signals.

4. The server computer of claim 1, wherein the plurality of walls include a front wall and a rear wall, and the input/output unit provides input/output connections through the front wall or the rear wall.

5. The server computer of claim 4, wherein the input/output unit is adjacent to the rear wall.

6. The server computer of claim 5, wherein at least a portion of the rear wall is transparent, and the transparent portion is adjacent to the input/output unit.

7. The server computer of claim 4, further including a proximity power switch that controls power in the server computer, the proximity power switch does not have any physical structure thereof extending through any of the plurality of walls.

8. The server computer of claim 7, wherein the proximity power switch is adjacent to the front wall.

9. The server computer of claim 1, further including a wireless power transfer mechanism inside the housing adjacent to one of the walls, the wireless power transfer mechanism is configured to receive power from an exterior of the housing and provide power to the computer components on the server logic board, and the wireless power transfer mechanism does not have any physical structure thereof extending through any of the plurality of walls.

10. The server computer of claim 9, wherein the wireless power transfer mechanism comprises an induction mechanism.

11. A liquid submersion-cooled server computer array, comprising:
   a plurality of server computers of claim 1 arranged in an array on a server rack.

12. The liquid submersion-cooled server computer array of claim 11, wherein the server rack includes a plurality of input/output ports, and the input/output units are configured to receive/transmit signals from/to the input/output ports.

13. The liquid submersion-cooled server computer array of claim 11, wherein the sever rack includes a plurality of power ports for wireless power transfer with a wireless power transfer mechanism in each server computer.

14. A server computer, comprising:
   a housing including a plurality of walls that define a liquid-tight interior space;
   a liquid inlet in a wall of the housing;
   a liquid outlet in a wall of the housing;
   a server logic board disposed in the interior space of the housing, and heat generating computer components disposed on the server logic board;
   a dielectric cooling liquid disposed within the interior space and submerging the heat generating computer components; and
   a wireless power transfer mechanism inside the housing adjacent to one of the walls, the wireless power transfer mechanism is configured to receive power from an exterior of the housing and provide power to the computer components on the server logic board, and the wireless power transfer mechanism does not have any physical structure thereof extending through any of the plurality of walls.

15. The server computer of claim 14, wherein the wireless power transfer mechanism comprises an induction mechanism.

16. The server computer of claim 14, further comprising means for optically passing input/output signals to/from the server logic board, the means for optically passing input/output signals does not have any physical structure thereof extending through any of the plurality of walls.

17. The server computer of claim 14, further comprising a proximity power switch that controls power in the server computer, the proximity power switch does not have any physical structure thereof extending through any of the plurality of walls.

18. A server computer, comprising:
   a housing including a plurality of walls that define a liquid-tight interior space;
   a liquid inlet in a wall of the housing;
   a liquid outlet in a wall of the housing;
   a server logic board disposed in the interior space of the housing, and heat generating computer components disposed on the server logic board;
   a dielectric cooling liquid disposed within the interior space and submerging the heat generating computer components; and
   a proximity power switch that controls power in the server computer, the proximity power switch does not have any physical structure thereof extending through any of the plurality of walls.

19. The server computer of claim 18, further comprising means for optically passing input/output signals to/from the server logic board, the means for optically passing input/output signals does not have any physical structure thereof extending through any of the plurality of walls.

20. The server computer of claim 18, further comprising means for wirelessly transferring power into the interior space of the housing, the means for wirelessly transferring power does not have any physical structure thereof extending through any of the plurality of walls.

* * * * *